(12) United States Patent
Im (10) Patent No.: US 7,164,152 B2
(45) Date of Patent: Jan. 16, 2007

(54) LASER-IRRADIATED THIN FILMS HAVING VARIABLE THICKNESS

(75) Inventor: James Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 10/754,157

(22) Filed: Jan. 9, 2004

(65) Prior Publication Data

US 2005/0059223 A1    Mar. 17, 2005

Related U.S. Application Data

(60) Provisional application No. 60/503,424, filed on Sep. 16, 2003.

(51) Int. Cl.
  *H01L 29/04*  (2006.01)
  *H01L 31/036*  (2006.01)

(52) U.S. Cl. .............................. 257/64; 257/66; 257/70; 257/72

(58) Field of Classification Search ................. 257/72, 257/344, 347, 350, 356, 408, 763, 64, 65, 257/66, 67, 68, 69, 70
See application file for complete search history.

(56) References Cited

U.S. PATENT DOCUMENTS

| 3,632,205 | A | 1/1972 | Marcy |
| 4,234,358 | A | 11/1980 | Celler et al. |
| 4,309,225 | A | 1/1982 | Fan et al. |
| 4,382,658 | A | 5/1983 | Shields et al. |
| 4,456,371 | A | 6/1984 | Lin |
| 4,639,277 | A | 1/1987 | Hawkins |
| 4,691,983 | A | 9/1987 | Kobayashi et al. |
| 4,727,047 | A | 2/1988 | Bozler et al. |
| 4,758,533 | A | 7/1988 | Magee et al. |
| 4,793,694 | A | 12/1988 | Liu |

(Continued)

FOREIGN PATENT DOCUMENTS

DE    19839 718    9/1998

(Continued)

OTHER PUBLICATIONS

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

(Continued)

*Primary Examiner*—Zandra V. Smith
*Assistant Examiner*—Khanh Duong
(74) *Attorney, Agent, or Firm*—Wilmer Cutler Pickering Hale and Dorr LLP (57) ABSTRACT

A crystalline film includes a first crystalline region having a first film thickness and a first crystalline grain structure; and a second crystalline region having a second film thickness and a second crystalline grain structure. The first film thickness is greater than the second film thickness and the first and second film thicknesses are selected to provide a crystalline region having the degree and orientation of crystallization that is desired for a device component.

18 Claims, 8 Drawing Sheets

U.S. PATENT DOCUMENTS

| | | | |
|---|---|---|---|
| 4,800,179 A | 1/1989 | Mukai | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| RE33,836 E | 3/1992 | Resor, III et al. | |
| 5,145,808 A | 9/1992 | Sameshima et al. | |
| 5,204,659 A | 4/1993 | Sarma | |
| 5,233,207 A | 8/1993 | Anzai | |
| 5,285,236 A | 2/1994 | Jain | |
| 5,291,240 A | 3/1994 | Jain | |
| 5,304,357 A | 4/1994 | Sato et al. | |
| 5,373,803 A | 12/1994 | Noguchi et al. | |
| 5,395,481 A | 3/1995 | McCarthy | |
| 5,409,867 A | 4/1995 | Asano | |
| 5,453,594 A | 9/1995 | Konecny | |
| 5,456,763 A | 10/1995 | Kaschmitter et al. | |
| 5,496,768 A | 3/1996 | Kudo | |
| 5,512,494 A * | 4/1996 | Tanabe | 438/161 |
| 5,523,193 A | 6/1996 | Nelson | |
| 5,529,951 A | 6/1996 | Noguchi et al. | |
| 5,591,668 A | 1/1997 | Maegawa et al. | |
| 5,710,050 A * | 1/1998 | Makita et al. | 438/486 |
| 5,721,606 A | 2/1998 | Jain | |
| 5,742,426 A | 4/1998 | York | |
| 5,756,364 A | 5/1998 | Tanaka et al. | |
| 5,766,989 A | 6/1998 | Maegawa et al. | |
| 5,844,588 A | 12/1998 | Anderson | |
| 5,861,991 A | 1/1999 | Fork | |
| 5,893,990 A | 4/1999 | Tanaka | |
| 5,986,807 A | 11/1999 | Fork | |
| 6,014,944 A | 1/2000 | Aklufi et al. | |
| 6,072,631 A | 6/2000 | Guenther et al. | |
| 6,081,381 A | 6/2000 | Shalapenok et al. | |
| 6,117,752 A | 9/2000 | Suzuki | |
| 6,120,976 A | 9/2000 | Treadwell et al. | |
| 6,130,009 A | 10/2000 | Smith et al. | |
| 6,130,455 A | 10/2000 | Yoshinouchi | |
| 6,156,997 A | 12/2000 | Yamazaki et al. | |
| 6,162,711 A | 12/2000 | Ma et al. | |
| 6,169,014 B1 | 1/2001 | McCulloch | |
| 6,172,820 B1 | 1/2001 | Kuwahara | |
| 6,177,301 B1 | 1/2001 | Jung | |
| 6,187,088 B1 | 2/2001 | Okumura | |
| 6,190,985 B1 | 2/2001 | Buynoski | |
| 6,193,796 B1 | 2/2001 | Yang | |
| 6,203,952 B1 | 3/2001 | O'Brien et al. | |
| 6,235,614 B1 | 5/2001 | Yang | |
| 6,242,291 B1 | 6/2001 | Kusumoto et al. | |
| 6,285,001 B1 | 9/2001 | Fleming et al. | |
| 6,300,175 B1 | 10/2001 | Moon | |
| 6,313,435 B1 | 11/2001 | Shoemaker et al. | |
| 6,316,338 B1 | 11/2001 | Jung | |
| 6,320,227 B1 | 11/2001 | Lee et al. | |
| 6,322,625 B1 | 11/2001 | Im | 117/43 |
| 6,326,186 B1 | 12/2001 | Kirk et al. | |
| 6,326,286 B1 | 12/2001 | Park et al. | |
| 6,333,232 B1 | 12/2001 | Kunikiyo | |
| 6,341,042 B1 | 1/2002 | Matsunaka et al. | |
| 6,348,990 B1 | 2/2002 | Igasaki et al. | |
| 6,353,218 B1 | 3/2002 | Yamazaki et al. | |
| 6,358,784 B1 | 3/2002 | Zhang et al. | |
| 6,368,945 B1 | 4/2002 | Im | 438/487 |
| 6,388,146 B1 | 5/2002 | Onishi et al. | |
| 6,388,386 B1 | 5/2002 | Kunii et al. | |
| 6,392,810 B1 | 5/2002 | Tanaka | 359/622 |
| 6,393,042 B1 | 5/2002 | Tanaka | |
| 6,407,012 B1 | 6/2002 | Miyasaka et al. | |
| 6,410,373 B1 | 6/2002 | Chang et al. | |
| 6,429,100 B1 | 8/2002 | Yoneda | |
| 6,432,758 B1 | 8/2002 | Cheng et al. | |
| 6,444,506 B1 | 9/2002 | Kusumoto et al. | |
| 6,445,359 B1 | 9/2002 | Ho | |
| 6,448,612 B1 | 9/2002 | Miyazaki et al. | |
| 6,451,631 B1 | 9/2002 | Grigoropoulos et al. | 438/149 |
| 6,455,359 B1 | 9/2002 | Yamazaki et al. | |
| 6,468,845 B1 | 10/2002 | Nakajima et al. | |
| 6,472,684 B1 | 10/2002 | Yamazaki et al. | |
| 6,476,447 B1 | 11/2002 | Yamazaki et al. | |
| 6,482,722 B1 | 11/2002 | Kunii et al. | |
| 6,493,042 B1 | 12/2002 | Bozdagi et al. | |
| 6,495,067 B1 | 12/2002 | Ono | |
| 6,495,405 B1 | 12/2002 | Voutsas et al. | |
| 6,501,095 B1 | 12/2002 | Yamaguchi et al. | |
| 6,506,636 B1 | 1/2003 | Yamazaki et al. | |
| 6,511,718 B1 | 1/2003 | Paz de Araujo et al. | |
| 6,512,634 B1 | 1/2003 | Tanaka | |
| 6,516,009 B1 | 2/2003 | Tanaka | |
| 6,521,492 B1 | 2/2003 | Miyasaka et al. | |
| 6,526,585 B1 | 3/2003 | Hill | |
| 6,528,359 B1 | 3/2003 | Kusumoto et al. | |
| 6,535,535 B1 | 3/2003 | Yamazaki et al. | |
| 6,555,449 B1 | 4/2003 | Im | 438/487 |
| 6,563,077 B1 | 5/2003 | Im | |
| 6,573,163 B1 | 6/2003 | Voutsas et al. | 438/487 |
| 6,573,531 B1 | 6/2003 | Im et al. | |
| 6,577,380 B1 | 6/2003 | Sposili et al. | |
| 6,582,827 B1 | 6/2003 | Im | |
| 6,590,228 B1 | 7/2003 | Voutsas et al. | 257/70 |
| 6,608,326 B1 | 8/2003 | Shinagawa et al. | 257/64 |
| 6,621,044 B1 | 9/2003 | Jain et al. | |
| 6,635,554 B1 | 10/2003 | Im et al. | |
| 6,635,932 B1 | 10/2003 | Grigoropoulos et al. | |
| 6,667,198 B1 | 12/2003 | Shimoto | |
| 6,693,258 B1 * | 2/2004 | Sugano et al. | 219/121.8 |
| 6,734,635 B1 | 5/2004 | Kunii et al. | |
| 6,784,455 B1 * | 8/2004 | Maekawa et al. | 257/66 |
| 6,830,993 B1 | 12/2004 | Im et al. | |
| 6,858,477 B1 * | 2/2005 | Deane et al. | 438/149 |
| 6,908,835 B1 | 6/2005 | Sposili et al. | |
| 6,961,117 B1 | 11/2005 | Im | |
| 2001/0001745 A1 | 5/2001 | Im et al. | |
| 2001/0041426 A1 | 11/2001 | Im | |
| 2002/0083557 A1 | 7/2002 | Jung | |
| 2002/0104750 A1 | 8/2002 | Ito | |
| 2002/0151115 A1 | 10/2002 | Nakajima et al. | |
| 2003/0006221 A1 | 1/2003 | Hong et al. | |
| 2003/0013278 A1 | 1/2003 | Jang et al. | |
| 2003/0029212 A1 | 2/2003 | Im | |
| 2003/0068836 A1 | 4/2003 | Hongo et al. | |
| 2003/0096489 A1 | 5/2003 | Im et al. | |
| 2003/0119286 A1 | 6/2003 | Im et al. | |
| 2003/0148565 A1 | 8/2003 | Yamanaka | |
| 2004/0053450 A1 | 3/2004 | Sposili et al. | |
| 2004/0061843 A1 | 4/2004 | Im | |
| 2004/0222187 A1 | 11/2004 | Lin | |
| 2005/0032249 A1 | 2/2005 | Im et al. | |
| 2005/0034653 A1 | 2/2005 | Im et al. | |
| 2005/0059265 A1 | 3/2005 | Im | |
| 2005/0202654 A1 | 9/2005 | Im | |

FOREIGN PATENT DOCUMENTS

| | | |
|---|---|---|
| DE | 10103 670 | 1/2001 |
| EP | 681316 | 8/1995 |
| EP | 655774 | 7/1996 |
| EP | 2338342 | 12/1999 |
| EP | 1067593 | 10/2001 |
| GB | 2338343 | 12/1999 |
| GB | 2338597 | 12/1999 |
| JP | 62181419 | 8/1987 |

| | | |
|---|---|---|
| JP | 2283036 | 11/1990 |
| JP | 04033327 | 2/1992 |
| JP | 04-279064 | * 10/1992 |
| JP | 6252048 | 9/1994 |
| JP | 6283422 | 10/1994 |
| JP | 7176757 | 7/1995 |
| JP | 11064883 | 3/1999 |
| JP | 11-281997 | * 10/1999 |
| JP | 2001023920 | 1/2001 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 A1 | 3/2001 |
| WO | WO 01/18854 A1 | 3/2001 |
| WO | WO-01/18855 | 3/2001 |
| WO | WO-01/71786 | 9/2001 |
| WO | WO-01/71791 | 9/2001 |
| WO | WO-02/031869 | 4/2002 |
| WO | WO-02/42847 | 5/2002 |
| WO | WO-02/086954 | 5/2002 |
| WO | WO-02/086955 | 10/2002 |
| WO | WO-01/18882 | 3/2003 |
| WO | WO-03/046965 | 6/2003 |
| WO | WO-03/084688 | 10/2003 |
| WO | WO-04/017379 | 2/2004 |
| WO | WO-04/017380 | 2/2004 |
| WO | WO-04/017382 | 2/2004 |
| WO | WO-2004/017381 A1 | 2/2004 |
| WO | WO-04/075263 | 9/2004 |
| WO | WO-05/029546 | 3/2005 |
| WO | WO-05/029548 | 3/2005 |
| WO | WO-05/029550 | 3/2005 |

OTHER PUBLICATIONS

Boyd, "Laser Processing of Thin Films and Microstructures, Oxidation, Deposition, and Etching of Insulators," Springer--Verlag Berlin Heidelber 1987.
Broadbent et al., "Excimer Laser Processing of Al-1%Cu/TiW Interconnect Layers," Proceedings, Sixth International IEEE VLSI Mutilevel Interconnection Conference, Santa Clara, CA, Jun. 12-13, pp. 336-345 (1989).
Brotherton et al., "Influence of Melt Depth in Laser Crystallized Poly-Si Thin Film Transistors," J. Appl. Phys., 82:4086 (1997).
Brotherton, "Polycrystalline Silicon Thin Film Transistors," Semicond. Sci. Tech., 10:721-738 (1995).
Crowder et al., "Low-Temperature Single-Crystal Si TFT's Fabricated on Si Films processed via Sequential Lateral Solidification", IEEE Electron Device Letter, 19 (8): 306 (1998).
Crowder et al., "Parametric investigation of SLS-processed polysilicon thin films for TFT application," Preparations and Characterization, Elsevier, Sequola, NL, vol. 427, No. 1-2, 3 Mar. 2003, pp. 101-107, XP004417451.
Crowder et al., "Sequential Lateral Solidification of PECVD and Sputter Deposited a-Si Films", Mat. Res. Soc. Symp. Proc. 621:Q. 9.7.1-9.7.6, 2000.
Endert et al., "Excimer Laser: A New Tool for Precision Micromachining," Optical and Quantum Electronics, 27:1319 (1995).
Fogarassy et al., "Pulsed Laser Crystallization of Hydrogen-Free a-Si Thin Films fof High-Mobility Poly-Si TFT Fabrication," Applied Physics A --Solids and Surfaces, 56:365-373 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of Si Films with a moveable-strip heater oven" J. Electro-Chem. Soc., 129:2812 (1982).

Gupta et al., "Numerical Analysis of Excimer-laser induced melting and solidification of Si Thin Films", Applied Phys. Lett., 71:99, 1997.
Hau-Riege et al., "The Effects Microstructural Transitions at Width Transitions on interconnect reliability," Journal of Applied Physics, 87(12): 8467-8472.
Im et al., "Controlled Super-Lateral Growth of Si Films for Microstructural Manipulation and Optimization", Phys. Stat. Sol. (a), 166:603 (1998).
Im et al., "Crystalline Si Films for Integrated Active-Matrix Liquid-Crystals Displays," MRS Bulletin 21:39 (1996).
Im et al. "On the Super Lateral Growth Phenomenon Observed in Excimer Laser-Induced Crystallization of Thin Si Films," Appl. Phys. Lett., 64 (17):2303 (1994).
Im et al., "Phase Transformation Mechanisms Involved in Excimer Laser Crystallization of Amorphous Silicon Films," Appl. Phys. Lett., 63 (14):1969 (1993).
Im et al., "Single-Crystal Si Films for Thin-Film Transistor Devices," Appl. Phys. Lett., 70(25):3434 (1997).
Ishida et al., "Ultra-shallow boxlike profiles fabricated by pulsed ultraviolet-laser doping process", J. Vac. Sci. Technol. B 12(1):399-403, (1994).
Ishihara et al., "A Novel Double-Pulse Exicern-Laser Crystallization Method of Silicon Thin-Films," Japanese Journal of Applied Physics, Publication Office Japanese Journal of Applied Physics, Tokyo, Japan, 34(8A):3976-3981 (1995).
Jeon et al., "Two-step laser recrystallization of poly-Si for effectiv control of grain boundaries", Journal of Non Crystalline Solids, 266-269: 645-649 (2000).
Kahlert, H., "Creating Crystals," OE Magazine, Nov. 2001, 33-35.
Kim, H. J. "Excimer-Laser-Induced Crystallization of Amorphous Silicon Thin Films", Ph. D. Dissertation Abstract, Columbia University, 1996.
Kim, H.J. et., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.J. et al., "Grain Boundary Location-Controlled Poly-Si Films for TFT Devices Obtained Via Novel Excimer Laser Process," Abstracts for Symposium of Materials Research Society, Nov. 27 to Dec. 2, p. 230 (1994).
Kim, H.J. et al., "Multiple Pulse Irradiation Effects in Excimer Laser-Induced Crystallization of Amorphous Si Films," Mat. Res. Soc. Sym. Proc., 321:665-670 (1994).
Kim, et al., "New Excimer-laser-crystallization method for producing large-grained and grain boundary-location-controlled Si Films for Thin Film Transistors", Applied Phys. Lett., 68:1513.
Leonard, J.P. et al, "Stochastic modeling of solid nucleation in supercooled liquids", Appl. Phys. Lett. 78:22, May 28, 2001, 3454-3456.
Mariucci et al., "Grain boundary location control by patterned metal film in excimer laser crystallized polysilico," Proceeding of the Fifth International Conference on Polycrystalline Semiconductors, Schwabisch Gmund, Germany, 67-68:175-180 (1998).
McWilliams et al., "Wafer-Scale Laser Pantography: Fabrication of N-Metak-Oxide-Semiconductor Transistors and Small-Scale Integrated Circuits By Direct-Write Laser-Induced Pyrolytic Reactions," Applied Physics Letters, American Institute of Physics, New York, US, 43(10): 946-948 (1983).
Micro/Las Lasersystem GMBH, "Overview of Beam Delivery Systems for Excimer Laser," (1999).
Micro/Las Lasersystem, GMBH, "UV Optics Systems for Excimer Laser Based Micromachining and Marketing" (1999).
Miyata et al, "Low-Temperature Polycrystalline Silicon Thin-Film Transistors for Large-Area Liquid Crystal Display," Japanese J. of Applied Physics Part 1--Regular Papers Short Notes & Review Papers, 31:4559-62 (1992).
Nebel, "Laser Interference Structuring of A-SI:h" Amorphours Silicon Technology--1996, San Francisco, CA Apr. 8-12, Materials Research Society Symposium Proceedings, vol. 420, Pittsburgh, PA (1996).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Posititon-Controlled Excimer-Laser-Crystallization of Silicon Thin Films on Glassy Substrate", Jpn. J. Appl. Phys. 38(10):5700-5705 (1999).

Sato et al., "Mobility anisotropy of electronis in inversion layers on oxidized silicon surfaces" Physical Review B (State) 4, 1950 (1971).

Song et al., "Single Crystal Si Islands on SiO2 Obtained Via Excimer Laser Inrradiation of Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2", Appl. Phys. Lett., 69(19): 2864 (1996).

Sposili et al., "Single-Crystal Si Films via a Low-Substrate-Temperature Excimer-Laser Crystallization Method", Mat. Res. Soc. Symp. Proc., 452: 953-958 (1997).

Watanabe et al., "Crystallization Process of Polycrystalline Silicon by KrF Excimer Laser Annealing," Japanese J. of Applied Physics Part 1 --Regular Papers Short Notes & Review Papers, 33:4491-98 (1994).

Weiner, K.H. et al. "Laser-assisted, Self-aligned Silicide Formation," A Verdant Technologies technical brief, Aug. 7, 1997, 1-9.

Weiner, K.H. et al., "Ultrashallow Junction Formation Using Projection Gas Immersion Laser Doping (PGILD)," A Verdant Technologies Technical Briet, Aug. 20, 1997.

White et al., "Characterization of thin-oxide MNOS memory transistors" IEEE Trans. Electron Devices ED-19, 1280 (1972).

Yamamuchi et al., "Polycrystalline silicon thin films processed with silicon Ion implantation and subsequent solid-phase crystallization: Theory, experiments, and thin-film transistor applications" Journal of Applied Physics, 75(7):3235-3257 (1994).

Yoshimoto et al., "Excimer-Laser-Produced and Two-Dimensionally Position-Controlled Giant Si Grains on Organic SOG Underlayer", p. 285-286, AM-LCD (2000).

* cited by examiner

1st Pulse

LASER-IRRADIATED THIN FILMS HAVING VARIABLE THICKNESS

CROSS-REFERENCE TO RELATED APPLICATIONS

This patent application claims priority under 35 U.S.C. § 119(e) to U.S. Provisional Patent Application Ser. No. 60/503,424 filed Sep. 16, 2003, which is hereby incorporated by reference.

FIELD OF THE INVENTION

This invention relates to methods and systems for processing thin films, and more particularly to forming crystalline semiconductor thin films from amorphous or polycrystalline thin films using laser irradiation. In particular the present invention relates to a method and system for the production of integrated thin film transistors.

BACKGROUND OF THE INVENTION

In recent years, various techniques for crystallizing or improving the crystallinity of an amorphous or polycrystalline semiconductor film have been investigated. This technology is used in the manufacture of a variety of devices, such as image sensors and active-matrix liquid-crystal display (AMLCD) devices. In the latter, a regular array of thin-film transistors (TFT) is fabricated on an appropriate transparent substrate, and each transistor serves as a pixel controller.

Semiconductor films are processed using excimer laser annealing (ELA), in which a region of the film is irradiated by an excimer laser to partially melt the film and then is crystallized. The process typically uses a long, narrow beam shape that is continuously advanced over the substrate surface, so that the beam can potentially irradiate the entire semiconductor thin film in a single scan across the surface ELA produces homogeneous small grained polycrystalline films; however, the method often suffers from microstructural non-uniformities which can be caused by pulse to pulse energy density fluctuations and/or non-uniform beam intensity profiles.

Sequential lateral solidification (SLS) using an excimer laser is one method that has been used to form high quality polycrystalline films having large and uniform grains. SLS produces large grains and controls the location of grain boundaries. A large-grained polycrystalline film can exhibit enhanced switching characteristics because the number of grain boundaries in the direction of electron flow is reduced. SLS systems and processes are described in U.S. Pat. Nos. 6,322,625, 6,368,945, and 6,555,449 issued to Dr. James Im, and U.S. patent application Ser. No. 09/390,537, the entire disclosures of which are incorporated herein by reference, and which are assigned to the common assignee of the present application.

In an SLS process, an initially amorphous (or small grain polycrystalline) film is irradiated by a very narrow laser beamlet. The beamlet is formed by passing a laser beam through a patterned mask, which is projected onto the surface of the film. The beamlet melts the amorphous film, which then recrystallizes to form one or more crystals. The crystals grow primarily inward from edges of the irradiated area. After an initial beamlet has crystallized a portion of the amorphous film, a second beamlet irradiates the film at a location less than the lateral growth length from the previous beamlet. In the newly irradiated film location, crystal grains grow laterally from the crystal seeds of the polycrystalline material formed in the previous step. As a result of this lateral growth, the crystals attain high quality along the direction of the advancing beamlet. The elongated crystal grains are separated by grain boundaries that run approximately parallel to the long grain axes, which are generally perpendicular to the length of the narrow beamlet. See FIG. 6 for an example of crystals grown according to this method.

When polycrystalline material is used to fabricate electronic devices, the total resistance to carrier transport is affected by the combination of barriers that a carrier has to cross as it travels under the influence of a given potential. Due to the additional number of grain boundaries that are crossed when the carrier travels in a direction perpendicular to the long grain axes of the polycrystalline material or when a carrier travels across a large number of small grains, the carrier will experience higher resistance as compared to the carrier traveling parallel to long grain axes. Therefore, the performance of devices such as TFTs fabricated on polycrystalline films will depend upon both the crystalline quality and crystalline orientation of the TFT channel relative to the long grain axes.

Devices that use a polycrystalline thin film often do not require that the entire thin film have the same system performance and/or mobility orientation. For example, the mobility requirements for the TFT column and row drivers (the integration regions) are considerably greater than for the pixel controllers or pixel regions. Processing the entire film surface, e.g., the integration regions and the pixel regions, under the conditions necessary to meet the high mobility requirements of the integration regions can be inefficient and uneconomical since excess irradiation and processing time of the lower performance regions of the thin film may have been expended with no gain in system performance.

SUMMARY OF THE INVENTION

The present invention recognizes that films of different thicknesses have different film properties. In particular, it is observed that for similarly processed films a thicker film exhibits a higher carrier mobility than a thinner film. This is observed for all directional solidification processes, such as CW-laser scanning, sequential laser solidification and zone melt refinement, and is true for films that have been processed, for example, using an excimer laser, a solid-state laser or a continuous wave laser as the laser source.

The present invention provides a crystalline film containing a first crystalline region having a first film thickness that is processed in a crystallization process to provide a first crystalline grain structure. The film further contains a second crystalline region having a second film thickness that is processed in a crystallization process to provide a second crystalline grain structure. The first and second film thicknesses are different and are selected to provide crystalline regions having selected degrees and orientations of crystallization. Typically, the region of greater thickness can contain the longer grains in the direction of crystal growth. Thicker films also often possess wider grains. The film is suitable for use, for example, in an integrated circuit device or as an active channel in a thin film transistor (TFT). The film may be a semiconductor material or a metal.

In one aspect of the invention, a method for processing a film includes (a) generating a first laser beam pattern from a pulsed laser beam, the laser beam pattern having an intensity that is sufficient to at least partially melt at least a portion of a first region of a film to be crystallized; (b) generating a second laser beam pattern from a pulsed laser beam, the second laser beam pattern having an intensity that is sufficient to at least partially melt at least a portion of a second region of the film to be crystallized, wherein the first region of the film comprises a first thickness and the second region of the film comprises a second thickness, and the first and second thicknesses are different; (c) irradiating the first region of the film with the first set of patterned beamlets to form a first crystalline region having a first grain structure; and (d) irradiating the second region of the film with the second set of patterned beamlets to form a second crystalline region having a second grain structure. The laser beam pattern includes a "set" of patterned beamlets, and the set of patterned beamlets includes one or more laser beamlets.

In one or more embodiments, the method further includes after step (c), repositioning the first laser beam pattern on the film to illuminate a second portion of the first region of the film, and irradiating the first region of the film as in step (c), the steps of repositioning and irradiating occurring at least once; and after step (d), repositioning the second laser beam pattern on the film to illuminate a second portion of the second region of the film, and irradiating the second region of the film as in step (d), the steps of repositioning and irradiating occurring at least once.

In one or more embodiments, the irradiation conditions are selected from those suitable for sequential laser solidification (SLS), excimer laser annealing (ELA) and uniform grain structure (UGS) crystallization. A plurality of laser beam sources can be used to generate a plurality of laser beam patterns. The plurality of laser beam sources can be used to irradiate the same or different regions of the film.

BRIEF DESCRIPTION OF THE DRAWING

Various objects, features, and advantages of the present invention can be more fully appreciated with reference to the following detailed description of the invention when considered in connection with the following drawing, in which like reference numerals identify like elements. The following drawings are for the purpose of illustration only and are not intended to be limiting of the invention, the scope of which is set forth in the claims that follow.

DETAILED DESCRIPTION OF THE INVENTION

The quality of a film that has been crystallized using a laser-induced crystallization growth technique depends, in part, on the thickness of the processed film. This observation is used to crystallize different regions of the film in an energy- and time-efficient manner and to provide a desired film characteristic. Laser-induced crystallization is typically accomplished by laser irradiation using a wavelength of energy that can be absorbed by the film. The laser source may be any conventional laser source, including but not limited to, excimer laser, continuous wave laser and solid-state laser. The irradiation beam pulse can be generated by other known sources for short energy pulses suitable for melting a semiconductor or metallic material. Such known sources can be a pulsed solid state laser, a chopped continuous wave laser, a pulsed electron beam and a pulsed ion beam, and the like.

Films of different thicknesses, although similarly processed, have different film properties. Thick films generally exhibit a higher electron mobility than similarly processed thin films. "Thick" and "thin" are used here in the relative sense, in that any film that is thicker relative to a second comparative film will exhibit improved film properties. A film can be situated on a substrate and can have one or more intermediate layers there between. The film can have a thickness between 100 Å and 10,000 Å so long as at least certain areas thereof can be completely or partially melted throughout their entire thickness. While the invention pertains to all films of all thicknesses susceptible to laser-induced crystallization, "thick" films typically can range from about 500 Å (50 nm) to about 10,000 Å (1 μm), and more typically from about 500 Å (50 nm) to about 5000 Å (500 nm); and "thin" films typically can range from about 100 Å (10 nm) to about 2000 Å (200 nm) and more typically about 200–500 Å (20–50 nm).

In one or more embodiments, the thin film may be a metal or semiconductor film. Exemplary metals include aluminum, copper, nickel, and molybdenum. Exemplary semiconductor films include conventional semiconductor materials, such as silicon, germanium, and silicon-germanium. It is also possible to use other elements or semiconductor materials for the semiconductor thin film. An intermediate layer situated beneath the semiconductor film can be made of silicon oxide, silicon nitride and/or mixtures of oxide, nitride or other materials that are suitable for use as a thermal insulator to protect the substrate from heat or as a diffusion barrier to prevent diffusion of impurities from the substrate to the film.

Although thick films demonstrate higher mobilities, it is more costly and time intensive to process them. For example, higher energy densities may be required in order to entirely melt through the thickness of the film. Since higher energy density is typically achieved by concentrating the laser beam into a smaller beam shape (cross-sectional area), smaller sections of the film surface can be processed at a time, so that sample throughput is reduced.

Thus according to one or more embodiments of the present invention, a semiconductor film to be crystallized having regions of different heights (film thicknesses) is provided. In those regions of the films where high electron mobility is required for optimal device function, the semiconductor film layer is "thick." In those regions of the film where lower electron mobility is adequate for device performance, a "thin" film is deposited. Thus, thick films are located only in those regions of the substrate requiring high speed or mobility, and the thick film regions are processed using a slower, more energy intensive crystallization process. The remaining surface (which is typically the bulk of the surface) is a thin film that is processed more rapidly using a low cost, low energy crystallization process.

Figure 1:
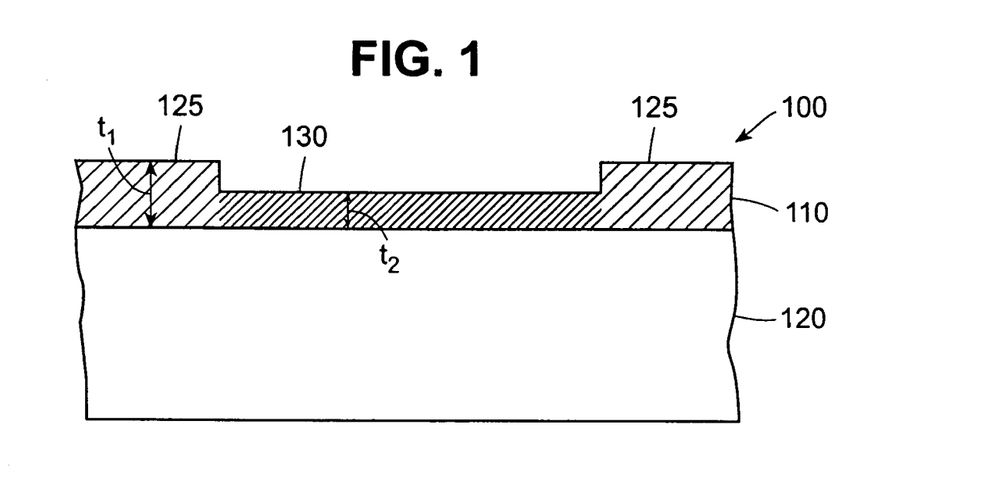
FIG. 1 is a cross-sectional illustration of a crystalline film having multiple film thickness regions according to one or more embodiments of the present invention.

FIG. 1 is a cross-sectional illustration of a thin film article 100 having multiple film thicknesses according to one or more embodiments of the present invention. A film 110 is deposited on a substrate 120. The film 110 has regions of different film thicknesses. Region 125 of the film has a film thickness $t_1$ that is greater than that of region 130 having a thickness of $t_2$. By way of example, $t_1$ is in the range of about 50–200 nm, and $t_2$ is in the range of about 20–50 nm. In addition, the polycrystalline grain structures of regions 125 and 130 differ. The grain structure may be polycrystalline or have large single crystalline subdomains. Region 125 possesses fewer grain boundaries or other defects per unit area than region 130; and region 125 has a higher mobility. Although the actual mobilities of the regions will vary dependent upon the composition of the film and the particular lateral crystallization techniques used, thick region 125 typically has a mobility in the range of greater than about 300 cm$^2$/V-s or about 300–400 cm$^2$/V-s and thin regions 130 typically have a mobility in the range of less than about 300 cm$^2$/V-s. In one or more embodiments of the present invention, regions 125 are the active channel regions for a high mobility device, such as a TFT integration region and region 130 is an active channel for a low mobility device such as a pixel control device. In one or more embodiments, the single crystalline subdomains of the crystalline regions are large enough to accommodate an active channel of an electronic device such as a TFT.

Figure 2A:
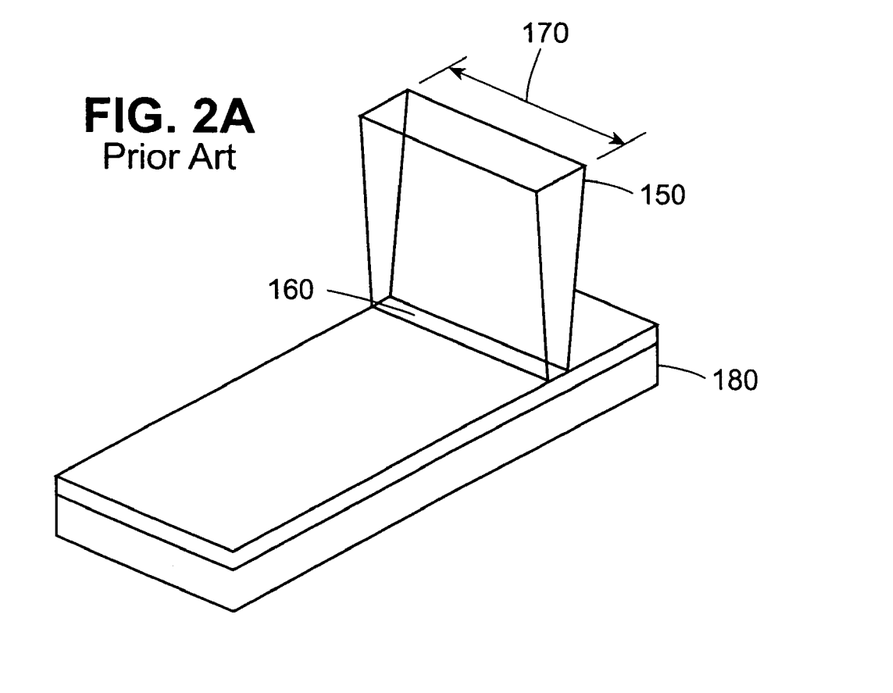
FIG. 2A illustrates the process of excimer laser annealing according to one or more embodiments of the present invention.

Improvements in crystal properties typically are observed regardless of the specific crystallization process employed. The films can be laterally or transversely crystallized, or the films can crystallize using spontaneous nucleation. By "lateral crystal growth" or "lateral crystallization," as those terms are used herein, it is meant a growth technique in which a region of a film is melted to the film/surface interface and in which recrystallization occurs in a crystallization front moving laterally across the substrate surface. By "transverse crystal growth" or "transverse crystallization," as those terms are used herein, it is meant a growth technique in which a region of film is partially melted, e.g., not through its entire thickness, and in which recrystallization occurs in a crystallization front moving through the film thickness, e.g., from the film surface towards the center of the film in a direction transverse to that of the above-described lateral crystallization. In spontaneous nucleation, crystal growth is statistically distributed over the melted regions and each nucleus grows until it meets other growing crystals. Exemplary crystallization techniques include excimer laser anneal (ELA), sequential lateral solidification (SLS), and uniform grain structure (UGS) crystallization Referring to FIG. 2A, the ELA process uses a long and narrow shaped beam 150 to irradiate the thin film. In ELA, a line-shaped and homogenized excimer laser beam is generated and scanned across the film surface. For example, the width 160 of the center portion of the ELA beam can be up to about 1 cm, typically about 0.4 mm, and the length 170 can be up to about 70 cm, typically about 400 mm, so that the beam can potentially irradiate the entire semiconductor thin film 180 in a single pass. The excimer laser light is very efficiently absorbed in, for example, an amorphous silicon surface layer without heating the underlying substrate. With the appropriate laser pulse duration (approx. 20–50 ns) and intensity (350–400 mJ/cm$^2$), the amorphous silicon layer is rapidly heated and melted; however, the energy dose is controlled so that the film is not totally melted down to the substrate. As the melt cools, recrystallization into a polycrystalline structure occurs. Line beam exposure is a multishot technique with an overlay of 90% to 99% between shots. The properties of silicon films are dependent upon the dose stability and homogeneity of the applied laser light. Line-beam exposure typically produces films with an electron mobility of 100 to 150 cm$^2$/Vs.

Figure 2B:
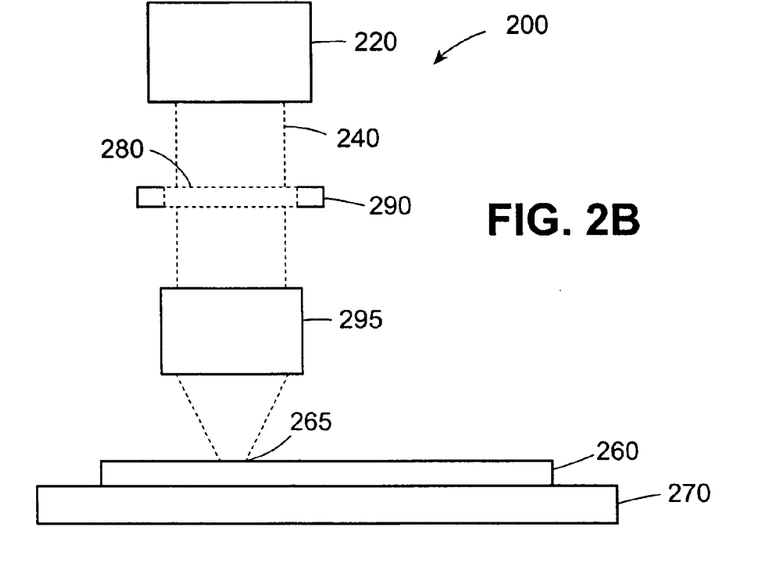
FIG. 2B is an exemplary system for performing sequential lateral solidification according to one or more embodiments of the present invention.

Referring to FIG. 2B, an apparatus 200 is shown that may be used for sequential lateral solidification and/or for uniform grain structure crystallization. Apparatus 200 has a laser source 220. Laser source 220 may include a laser (not shown) along with optics, including mirrors and lenses, which shape a laser beam 240 (shown by dotted lines) and direct it toward a substrate 260, which is supported by a stage 270. The laser beam 240 passes through a mask 280 supported by a mask holder 290. The laser beam pulses 240 generated by the beam source 220 provide a beam intensity in the range of 10 mJ/cm$^2$ to 1 J/cm$^2$, a pulse duration in the range of 10 to 300 ns, and a pulse repetition rate in the range of 10 Hz to 300 Hz. Currently available commercial lasers such as Lambda Steel 1000 available from Lambda Physik, Ft. Lauderdale, Fla., can achieve this output. Higher laser energy and larger mask sizes are contemplated as laser power increases. After passing through the mask 280, the laser beam 240 passes through projection optics 295 (shown schematically). The projection optics 295 reduces the size of the laser beam, and simultaneously increases the intensity of the optical energy striking the substrate 260 at a desired location 265. The demagnification is typically on the order of between 3× and 7×reduction, preferably a 5× reduction, in image size. For a 5× reduction the image of the mask 280 striking the surface at the location 265 has 25 times less total area than the mask, correspondingly increasing the energy density of the laser beam 240 at the location 265.

The stage 270 is a precision x-y stage that can accurately position the substrate 260 under the beam 240. The stage 270 can also be capable of motion along the z-axis, enabling it to move up and down to assist in focusing or defocusing the image of the mask 280 produced by the laser beam 240 at the location 265. In another embodiment of the method of the present invention, it is preferable for the stage 270 to also be able to rotate.

In uniform grain structure (UGS) crystallization, a film of uniform crystalline structure is obtained by masking a laser beam so that non-uniform edge regions of the laser beam do not irradiate the film. The mask can be relatively large, for example, it can be 1 cm×0.5 cm; however, it should be smaller than the laser beam size, so that edge irregularities in the laser beam are blocked. The laser beam provides sufficient energy to partially or completely melt the irradiated regions of the thin film. UGS crystallization provides a film having an edge region and a central region of uniform fine-grained polycrystals of different sizes. In the case where the laser irradiation energy is above the threshold for complete melting, the edge regions exhibit large, laterally grown crystals. In the case where the laser irradiation energy is below the threshold for complete melting, grain size will rapidly decrease from the edges of the irradiated region. For further detail, see U.S. application Ser. No. 60/405,084, filed Aug. 19, 2002 and entitled "Process and System for Laser Crystallization Processing of Semiconductor Film Regions on a Substrate to Minimize Edge Areas, and Structure of Such Semiconductor Film Regions," which is hereby incorporated by reference.

Sequential lateral solidification is a particularly useful lateral crystallization technique because it is capable of grain boundary location-controlled crystallization and provides crystal grain of exceptionally large size. Sequential lateral solidification produces large grained semiconductor, e.g., silicon, structures through small-scale translations between sequential pulses emitted by an excimer laser. The invention is described with specific reference to sequential lateral solidification of an amorphous silicon film; however, it is understood that the benefits of present invention can be readily obtained using other lateral crystallization techniques or other film materials.

Figure 3:
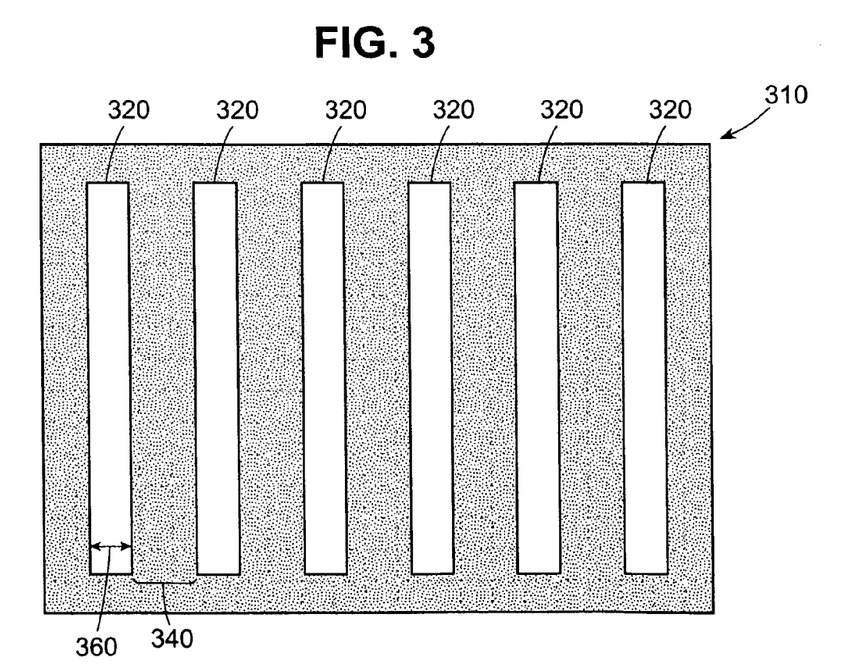
FIG. 3 shows a mask for using in sequential lateral solidification according to one or more embodiments of the present invention

FIG. 3 shows a mask 310 having a plurality of slits 320 with slit spacing 340. The mask can be fabricated from, for example, a quartz substrate and includes a metallic or dielectric coating that is etched by conventional techniques to form a mask having features of any shape or dimension. In one or more embodiments of the present invention, the length of the mask features is commensurate with the dimensions of the device that is to be fabricated on the substrate surface. The width 360 of the mask features also may vary. In one or more embodiments of the present invention, it is small enough to avoid small grain nucleation within the melt zone, yet large enough to maximize lateral crystalline growth for each excimer pulse. By way of example only, the mask feature can have a length of about 25 to about 1000 micrometers (µm) and a width of about two to five micrometers (µm).

An amorphous silicon thin film sample is processed into a single or polycrystalline silicon thin film by generating a plurality of excimer laser pulses of a predetermined fluence, controllably modulating the fluence of the excimer laser pulses, homogenizing the modulated laser pulses, masking portions of the homogenized modulated laser pulses to obtain a laser beam pattern, irradiating an amorphous silicon thin film sample with the laser beam pattern to effect melting of portions thereof irradiated by the beamlets, and controllably translating the sample with respect to the laser beam pattern (or vice versa) to thereby process the amorphous silicon thin film sample into a single crystal or grain boundary-controlled polycrystalline silicon thin film. In one or more embodiments of the sequential lateral solidification process, highly elongated crystal grains that are separated by grain boundaries that run approximately parallel to the long grain axes are produced. The method is illustrated with reference to FIG. 4 through FIG. 6.

Figure 4:
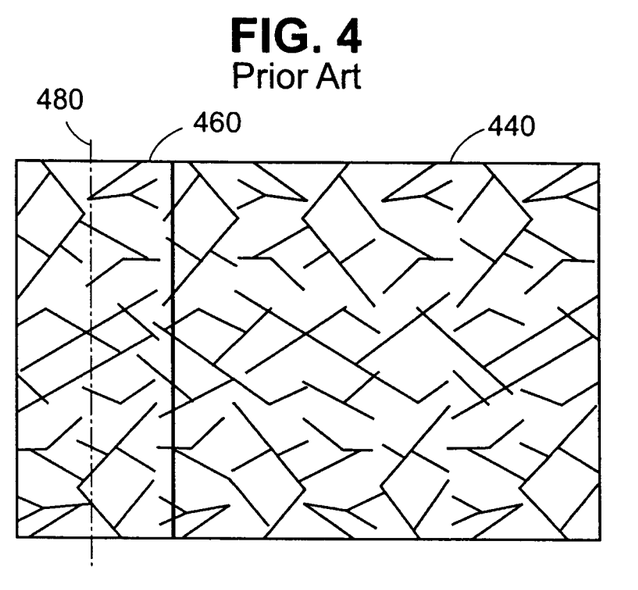
FIG. 4 illustrates a step in the process of sequential lateral solidification according to one or more embodiments of the present invention.

FIG. 4 shows the region 440 prior to crystallization. A pulsed laser beam pattern is directed at the rectangular area 460 causing the amorphous silicon to melt. Crystallization is initiated at solid boundaries of region 460 and continues inward towards centerline 480. The distance the crystal grows, which is also referred to as the characteristic lateral growth length, is a function of the amorphous silicon film thickness and the substrate temperature; however, the actual lateral growth length may be shorter if, for example, the growing crystals encounter a solid front. A typical lateral growth length for 50 nm thick film is approximately 1.2 micrometers. After each pulse the substrate (or mask) is displaced by an amount not greater than the actual lateral growth length. In order to improve the quality of the resultant crystals, the sample is advanced much less than the lateral crystal growth length, e.g., not more than one-half the lateral crystal growth length. A subsequent pulse is then directed at the new area. By displacing the image of the slits 460 a small distance, the crystals produced in preceding steps act as seed crystals for subsequent crystallization of adjacent material. By repeating the process of advancing the image of the slits and firing short pulses, the crystal grows epitaxially in the direction of the slits' movement.

Figure 5:
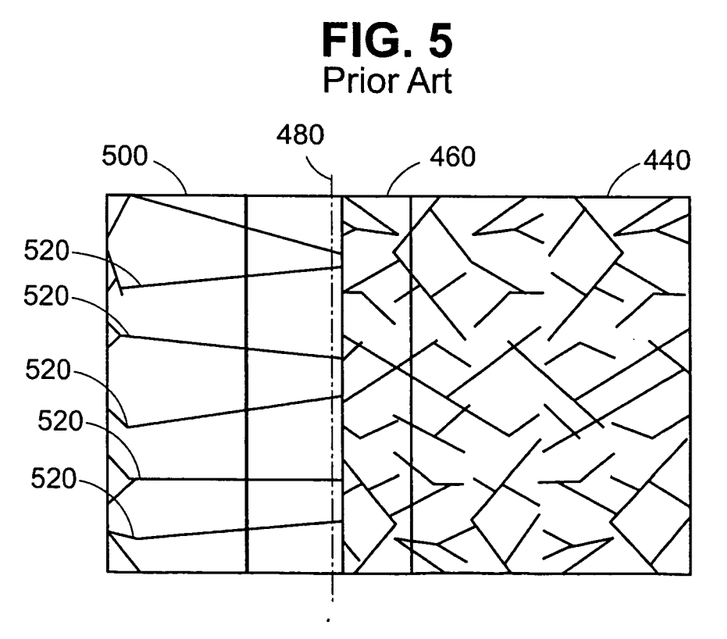
FIG. 5 illustrates a step in the process of sequential lateral solidification according to one or more embodiments of the present invention.

FIG. 5 shows the region 440 after several pulses. As is clearly shown, the area 500 that has already been treated has formed elongated crystals that have grown in a direction substantially perpendicular to the length of the slit. Substantially perpendicular means that a majority of lines formed by crystal grain boundaries 520 could be extended to intersect with dashed centerline 480.

Figure 6:
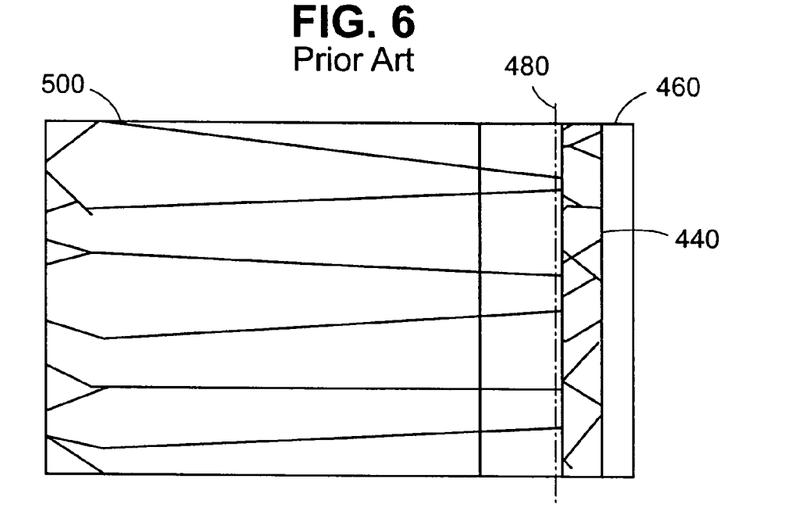
FIG. 6 illustrates a step in the process of sequential lateral solidification according to one or more embodiments of the present invention.

FIG. 6 shows the region 440 after several additional pulses following FIG. 5. The crystals have continued to grow in the direction of the slits' movement to form a polycrystalline region. The slits preferably continue to advance at substantially equal distances. Each slit advances until it reaches the edge of a polycrystalline region formed by the slit immediately preceding it.

The many microtranslations called for by the sequential lateral solidification process increase processing time; however, they produce a film having highly elongated, low defect grains. In one or more embodiments, this process is used to process the thick regions of the semiconductor film. The polycrystalline grains obtained using this process are typically of high mobility, e.g., 300–400 $cm^2$/V-s. This is the value typically found for devices with having parallel grain boundaries but few perpendicular grain boundaries. These highly elongated grains are well suited for the active channel regions in integration TFTs.

According to the above-described method of sequential lateral solidification, the entire film is crystallized using multiple pulses. This method is hereinafter referred to as an "n-shot" process, alluding to the fact that a variable, or "n", number of laser pulses ("shots") is required for complete crystallization. Further detail of the n-shot process is found in U.S. Pat. No. 6,322,625, entitled "Crystallization Processing of Semiconductor Film Regions on a Substrate and Devices Made Therewith," and in U.S. Pat. No. 6,368,945, entitled "System for Providing a Continuous Motion Sequential Lateral Solidification," both of which are incorporated in their entireties by reference.

In one or more embodiments, regions of the semiconductor film are processed using a sequential lateral solidification process that produces smaller crystal grains than those of the preceding "n-shot" method. The film regions are therefore of lower electron mobility; however the film is processed rapidly and with a minimum number of passes over the film substrate, thereby making it a cost-efficient processing technique. These crystallized regions are well suited for the thin film regions of the semiconductor thin film used as the active channel in pixel control TFTs.

Figure 7A:
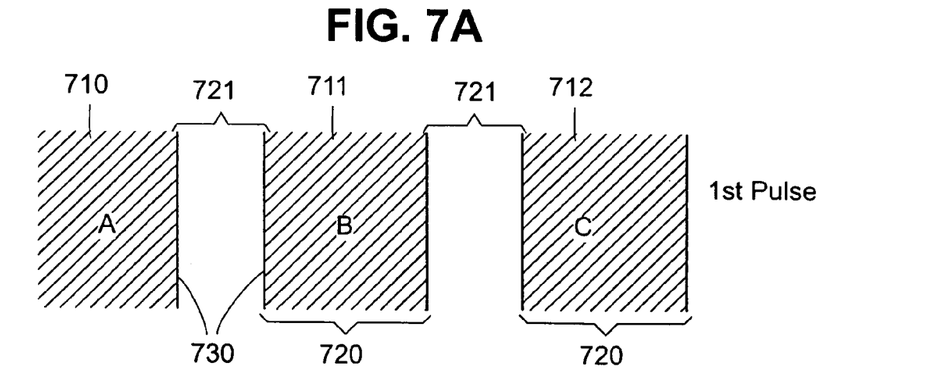
FIG. 7A through FIG. 7C illustrate a sequential lateral solidification process according to one or more embodiments of the present invention.
Figure 7B:
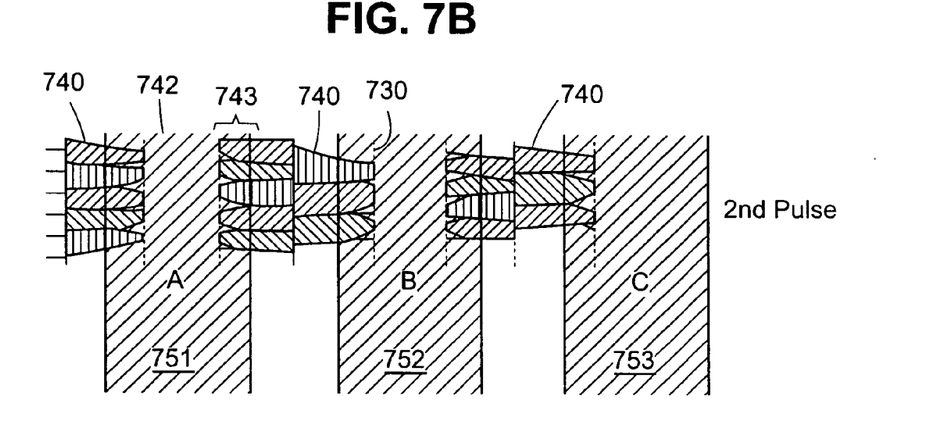

The process uses a mask such as that shown in FIG. 3, where closely packed mask slits 320 having a width 360, of about by way of example 4 µm, are each spaced apart by spacing 340 of about, by way of example, 2 µm. The sample is irradiated with a first laser pulse. As shown in FIG. 7A, the laser pulse melts regions 710, 711, 712 on the sample, where each melt region 720 is approximately 4 μm wide and is spaced approximately 2 μm apart to provide unmelted region 721. This first laser pulse induces crystal growth in the irradiated regions 710, 711, 712 starting from melt boundaries 730 and proceeding into the melt region, so that polycrystalline silicon 740 forms in the irradiated regions, as shown in FIG. 7B.

Figure 7C:
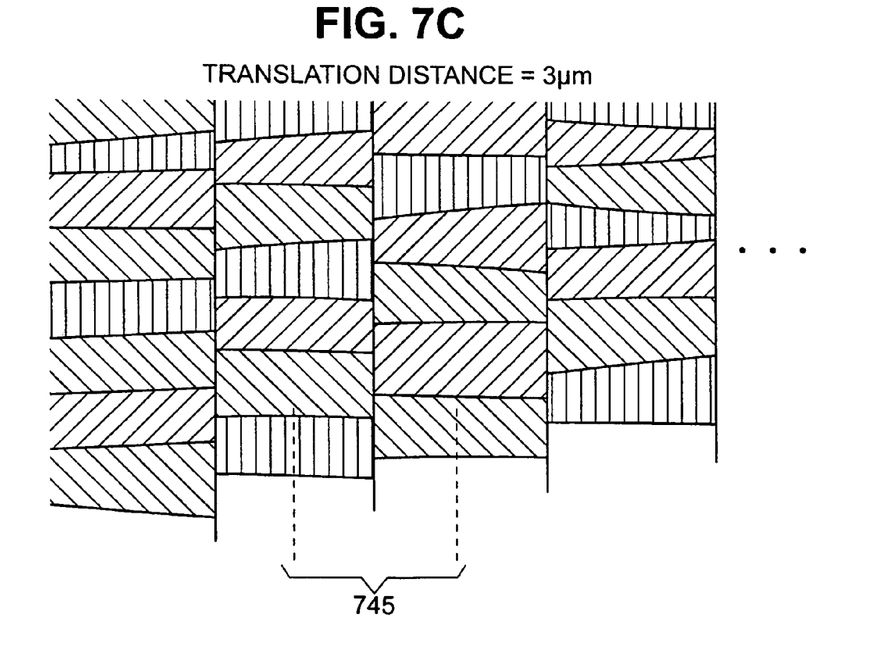

The sample is then translated a distance approaching, but more than, half the width of the mask feature, and the film is irradiated with a second excimer laser pulse. For example, in one embodiment, the sample (or mask) is translated a distance equal to ½(mask feature width 360+mask spacing 340). The second irradiation melts the remaining amorphous regions 742 spanning the recently crystallized regions 740 to form melt regions 751, 752 and 753. The initial crystal seed region 743 melts and serves as a site for lateral crystal growth. As shown in FIG. 7C, the crystal structure that forms the central section 745 outwardly grows upon solidification of melted regions 742, so that a uniform, long grain polycrystalline silicon region is formed.

According to the above-described method of sequential lateral solidification, the entire mask area is crystallized using only two laser pulses. This method is hereinafter referred to as a "two-shot" process, alluding to the fact that only two laser pulses ("shots") are required for complete crystallization. Further detail of the two-shot process is found in Published International Application No. WO 01/18854, entitled "Methods for Producing Uniform Large-Grained and Grain Boundary Location Manipulated Polycrystalline Thin Film Semiconductors Using Sequential Lateral Solidification," which is incorporated in its entirety by reference.

According to one or more embodiments of the present invention, a method for producing an article having thick film regions of high mobility and thin film regions of low mobility is provided. An exemplary process set forth in the flow diagram 800 of FIG. 8.

Figure 8:
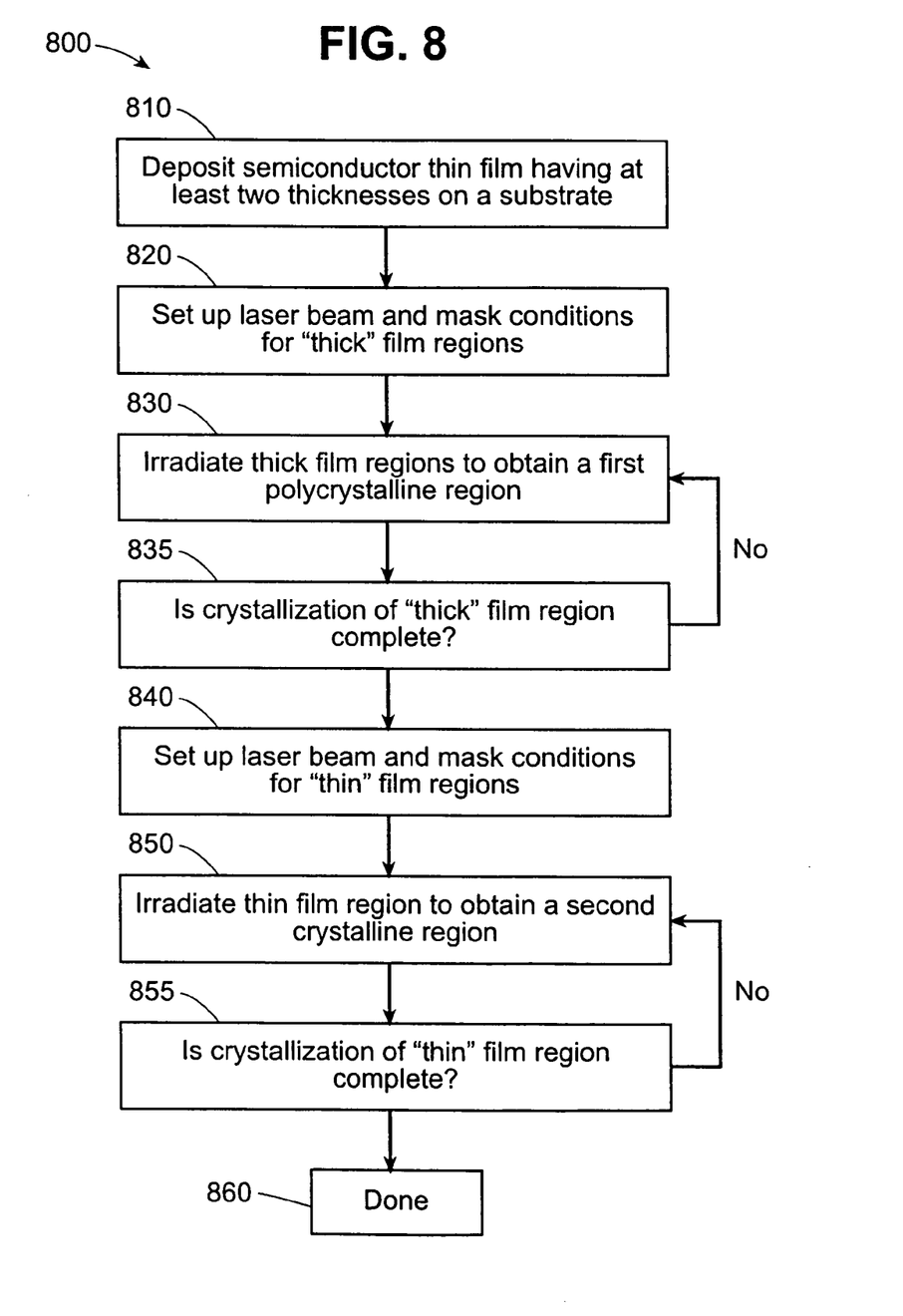
FIG. 8 is a flow chart of an exemplary process according to one or more embodiments of the present invention in which two different thickness regions of the film are processed.

In step 810 a thin film having at least two thicknesses is deposited on a substrate, with each film thickness intended to provide crystalline regions having different film properties. In one or more embodiments, the film property of interest is mobility; however other film properties such as crystal orientation, crystal size, and grain defects can also be considered. Of course, the film can have more than two film thickness regions to thereby provide more than two different film properties. The size and placement of devices on the film is selected to correspond to the different film thickness regions. For example, pixel control devices are located in regions of thinner film thickness and integration devices are located in regions of thicker film thickness.

The fabrication of films of different thicknesses is known in the art. For example, a film can be deposited evenly across the substrate, and thereafter sections thereof are removed, e.g., etched or polished, to form regions of thicker and thinner film thicknesses. In some exemplary embodiments, the film is etched back to expose the underlying substrate, and a second layer of semiconductor material is deposited over the exposed substrate and existing semiconductor layer to form a film of different thicknesses. Alternatively, the film is etched so as to remove some, but not all, of the semiconductor material in the thin film regions. In other exemplary embodiments, photolithography can be used to pattern the film surface, followed by selective deposition or material removal in the exposed regions of the patterned substrate.

In step 820 the laser beam conditions (beam shape, beam energy density, beam homogeneity, etc.) and mask design (where present) are selected for processing the thick regions of the semiconductor film. The order of irradiation is not critical to the invention and either thick or thin film regions can be processed first, or they can be processed simultaneously. As is discussed in greater detail below, one or more laser beam sources may be used to generate the laser beam pattern that irradiates the film surface. A laser beam generated from a laser beam source may be split or steered to generate secondary laser beams, each of which can be shaped using masks and/or laser optics to provide patterned beamlets with desired characteristics.

In step 830 the "thick" film region of the semiconductor film is irradiated to obtain a first crystalline region. According to one or more embodiments of the present invention, the region is irradiated in a sequential lateral solidification "n"-shot process. The first crystalline region may include the entire "thick" film region, such that the film is crystallized up to the edge of the thick film region. Edge melting may result in material flow at the interface between the thick and thin films; however, rapid recrystallization and surface tension are expected to limit material flow. Alternatively, the entire thick film region may not be irradiated, forming for example an amorphous border between the "thick" and "thin" film regions.

In step 835, it is determined whether thick film processing is complete. If not, the process returns to step 830 to process a new portion of the thick film region. If thick film region is crystallized, the step is complete, and the process advances to the next step.

In step 840 the laser beam conditions (beam shape, beam energy density, beam homogeneity, demagnification, etc.) and mask design are selected for processing the thin regions of the semiconductor film. The order of irradiation is not critical to the invention, and this step is carried out before, during or after processing of the thick film. As is the case for the thick film region, one or more laser sources can be used to generate the laser beamlets used to irradiate the thin film regions of the film. In addition, the laser beam generated from a laser beam source may be split or steered to generate secondary laser beams, each of which can be shaped using masks and/or laser optics to provide patterned beamlets with desired characteristics.

In step 850 the "thin" film region of the semiconductor film is irradiated to obtain a second crystalline region. According to one or more embodiments of the present invention, the region is irradiated in a sequential lateral solidification two-shot process. ELA and UGS crystallization can also be used to provide a crystalline region of uniform grain structure.

In step 855, it is determined whether the thin film processing is complete. If not, then the process returns to step 850 and a new portion of the thin film is irradiated. If complete, the process advances to step 860 and is done.

Variations of the process are contemplated within the scope of the present invention. For example, the crystallization method used for the first and second regions of the film can be the same or different. In one or more embodiments, the thick film regions requiring higher mobility can be processed using a technique such as SLS that produces elongated, grain boundary location-controlled grain structure, and the thin film regions can be processed using a less expensive technique, such as UGS crystallization. In one or more embodiments of the present invention, a portion of the "thick" and/or "thin" regions are processed. The remaining unprocessed portions remain in the as-deposited crystalline state, e.g., amorphous or small-grained polycrystalline. The size and location of the processed and unprocessed regions of the "thick" and/or "thin" regions may be selected, for example, to correspond to devices to be located on the film.

By way of further example, even when using the same crystallization technique, the masks for the first and second irradiations can be the same or different. When the masks are the same, then the conditions of irradiation typically may vary, as for example described above where an "n"-step and a two-step process are used for the two film thickness regions. In some embodiments, different masks are used for the first and second irradiations. For example, the orientation of the mask features can vary so that crystal growth proceeds in different directions on the film. Mask orientation can be varied by rotating the mask or the substrate stage on which the sample rests or by using different masks.

In some embodiments, the laser features, e.g., the laser beam shape and energy density, can be modified so that each region of the amorphous film is irradiated with a laser beam (i.e., a laser beam pattern) having different beam characteristics, e.g., beam energy profile (density), beam shape, beam pulse duration, etc. The beam characteristics of the laser beams being delivered to the amorphous film can be controlled and modulated via the optical elements, e.g., lenses, homogenizers, attenuators, and demagnification optics, etc., and the configuration and orientation of a mask(s), if present. By modulating the beam characteristics of the laser beams in accordance with the processing requirements (to facilitate crystallization) of the film portion to be irradiated, the laser source's output energy can be more efficiently utilized in the crystallization fabrication process, which in turn can lead to improved (i.e., shorter) film processing times and/or lower energy processing requirements. Accordingly, the laser beams can be controlled and modulated so that different regions of the film that have different processing requirements are irradiated by laser beams having different beam characteristics. For example, the "thin" portions of the amorphous film layer can be subjected to laser beams that have certain energy beam characteristics while the "thick" portions of the film layer can be subjected to laser beams that have different energy beam characteristics.

Laser beams having differing energy beam characteristics can be generated and delivered to the amorphous film using systems that have a single optical path or, alternatively, have a plurality of optical paths. An optical path, as that term is used herein, refers to the trajectory of a laser beam pulse as the laser beam pulse travels from a laser beam source to a thin film sample. Optical paths thus extend through both the illumination and projection portions of the exemplary systems. Each optical path has at least one optical element that is capable of manipulating the energy beam characteristics of a laser beam pulse that is directed along that optical path.

In systems having a single optical path, one or more of the optical elements and the mask (if present) can be adjusted, inserted or substituted, etc., within the optical path so as provide laser beamlets having different energy beam characteristics. Additionally, the orientation of the substrate, relative to the orientation of the incoming laser beams, can also be adjusted to effectively produce a laser beam that has different energy beam characteristics. In one or more embodiments, for example, the laser system can include a mask that is rotatable via a mask holder. The mask is held in a first position to facilitate the irradiation processing of a first portion of the film and then is rotated to a second position, e.g., rotate 90°, to facilitate the irradiation processing of a second portion of the film. In one or more embodiments, the laser system can include two masks having different masking shapes being located on a mask holder. To irradiate a first portion of the silicon film, the first mask is aligned with the laser beam optical path via the mask holder. To irradiate a second portion, the second mask is then aligned with the laser beam optical path via the mask holder, e.g., the mask holder can be a rotatable disk cartridge. In yet another embodiment, for example, the system can include an adjustable demagnification optical element. To generate laser beams having differing energy beam characteristics, the adjustable demagnification optical element is set to a first magnification during the irradiation of a portion of the amorphous film and then set to a different magnification during the irradiation of another portion of the amorphous film. Thus, laser beams having different energy beam characteristics can be generated and delivered to the amorphous film on the same optical path. Other modification to modify beam characteristics of a laser beam in a single optical path will be apparent to those of skill in the art.

Generating laser beam with different beam characteristics along a single optical path may cause the crystallization processing times to otherwise increase in some circumstances since the delivery of the irradiation energy to the amorphous film may need to be interrupted to facilitate the modulation of the energy beam characteristics. In this instance, a system having a single laser beam path may not be advantageous since the changing of the optical elements, the mask configuration or orientation, or the substrate orientation, etc., to facilitate an adjustment of the laser beam characteristics could dramatically lower the duty cycle of the delivered laser energy. In one or more embodiments and to generate laser beams having differing energy beam characteristics while maintaining an acceptable delivered irradiation duty cycle, the systems for irradiating the amorphous film can include a plurality of optical paths. As shown schematically in FIG. 9, in some embodiments the system can include two optical paths for controlling and modulating the laser beam, each of which can include the necessary beam optics, e.g., beam homogenizers, demagnification optics, mirrors, lenses, etc., and (optionally) a mask to modulate the beam characteristics of the laser beam and direct the laser beam to portions of the amorphous film so that crystallization can be promoted. Accordingly, the dual (or multiple) optical path system can be used to generate laser beams of different beam characteristics, which are used to irradiate and crystallize the different film regions of the film. Thus, a first laser beam having a first set of beam characteristics is generated and delivered via a first optical path. A selected portion of the film is irradiated with the first laser beam using a first crystallization process to obtain a first crystalline region. The crystalline region corresponds to a region of the film having a selected film thickness. Upon completion of or concurrent with the first irradiation step, the laser beam is redirected onto a second optical path that generates a laser beam having a second set of beam characteristics. A selected portion of the film is irradiated with the second laser beam using a second crystallization process to obtain a second crystalline region. The crystalline regions can correspond to regions of the film having different selected film thicknesses. The crystalline regions can be polycrystalline or have large single crystalline domains.

Figure 9:
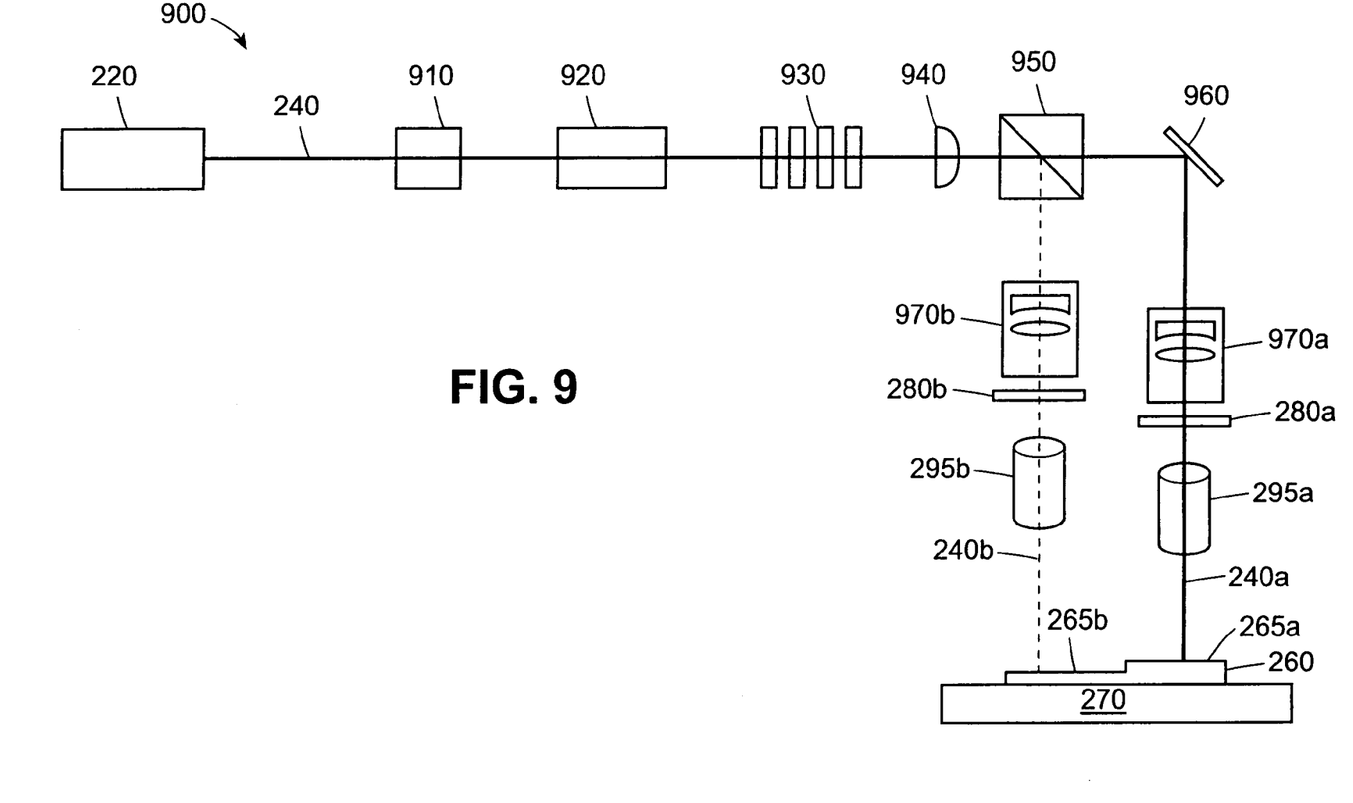
FIG. 9 is an illustration of an apparatus having two optical pathways using a single laser for use in one or more embodiments of the present invention.

An exemplary apparatus having dual optical paths that can generate and deliver laser beams having different energy beam characteristics to a film is shown in FIG. 9. Referring to FIG. 9, the system 900 includes a laser source 220, an attenuator 910, a telescope 920, a homogenizer 930, a condenser lens 940 and a beam steering element 950. The laser beam 240 generated by the laser source 220 is directed to the beam steering element 950 via the attenuator 910, telescope 920, homogenizer 930 and condenser lens 940. The attenuator 910, which may be used in conjunction with a pulse duration extender, can be a variable attenuator, e.g., having a dynamic range capable of adjusting the energy density of the generated laser beams 240. The telescope 920 can be used to efficiently adapt the beam profile of the laser beams 240 to the aperture of the homogenizer 930. The homogenizer 930 can consist of two pairs of lens arrays (two lens arrays for each beam axis) that are capable of generating a laser beam 240 that have a uniform energy density profile. The condenser lens 940 can condense the laser beam 240 onto a downstream optical element.

At the beam steering element 950, the incoming laser beams 240 are directed along one of two different out-going optical paths, each of which leads to the substrate 260 that is mounted on the wafer-handling stage 270. The first optical path includes a mirror 960, a variable-focus field lens 970a, a mask 280a and a projection lens 295a, while the second optical path includes a variable-focus field lens 970b, a mask 280b and a projection lens 295b. The masks 280a and 280b are typically mounted to mask stages (not shown) that are capable of accurately positioning the masks (e.g., in three dimensions) in relationship to the incoming laser beams 240. Laser beams 240 traveling along the two different optical paths pass through optical elements that have different optical properties. For example, in one embodiment, the mask 280a of the first optical path has a different masking configuration than the mask 280b of the second optical path. Thus, laser beam 240a, which is directed to region 265a of substrate 260 via the first optical path, will have energy beam characteristics that are different from the energy beam characteristics of the laser beam 240b that is directed to region 265b of substrate 260 via the second optical path. Regions 265a, 265b are shown as having different film thicknesses.

In certain embodiments, the beam steering element 950 can have two modes: a transmissive or pass-through mode and a reflective or redirect mode. While operating in a pass-through mode, the laser beams 240 entering the beam steering element 950 essentially pass completely through the beam steering element 950 onto a first optical path. While operating in a redirect mode, the laser beams 240 entering the beam steering element 950 are essentially completely redirected by a reflective surface(s) onto a second optical path.

The wafer-handling stage 270 is capable of accurately positioning the substrate 260 masks (e.g., in three dimensions) in relationship to the incoming laser beams 240a and 240b. As previously discussed, the dual-thickness amorphous film is deposited in a controlled manner upon a surface of the substrate 260. Laser beam(s) 240 can then be directed to the second optical path via the beam steering element 950 so that laser beam(s) 240b having second beam characteristics are generated and directed to different portions of the film. Therefore, by coordinating (i.e., via a computer) the generation of the laser beam 240, the operations of the beam steering element 950 and the positioning of the substrate 260 via the wafer-handling stage 270, the delivery of laser beams 240a and 240b (having different beam characteristics) to different portions of the amorphous film can be facilitated.

In other exemplary embodiments, the beam steering element 950 is a beam splitter that allows a portion of the laser beam to pass through the beam splitter to pathway 240a and a portion of the laser beam to be redirected along pathway 240b so that different portions of the thin film can be irradiated at the same time.

Figure 10:
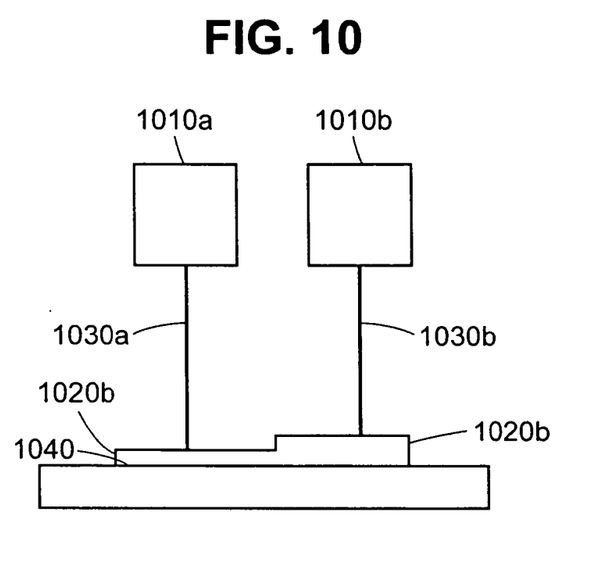
FIG. 10 is an illustration of an apparatus having two laser systems and two optical pathways for use in one or more embodiments of the present invention.

In other exemplary embodiments, a plurality of laser sources and a plurality of optical paths, such as those described in detail above, can be employed. Each laser source generates a laser beam(s) that can be directed along a corresponding optical path so as to produce a laser beam(s) having specific beam characteristics. The laser beam(s) can then be directed via the optical path to a region of the thin film. For example, a laser beam(s) from the laser source can be directed along the first optical path so that a laser beam(s) having first beam characteristics is produced and delivered to certain portions of the film while a laser beam(s) from a second laser source can be directed along a second optical path so that a laser beam(s) having different beam characteristics is produced and delivered to certain other portions of the film. This is illustrated schematically in FIG. 10, in which two laser sources are shown as boxes 1010a and 1010b. The optical elements of optical pathways 1030a and 1030b may be variously arranged as is understood in the art and may include some or all of the optical elements, e.g., beam homogenizers, demagnification optics, mirrors, lenses, etc., that are described herein. Laser beam(s) generated by laser source 1010a travel along optical pathway 1030a (thereby producing laser beam(s) having certain energy beam characteristics) and are delivered to the "thin" region 1020a of the thin film. Laser beam(s) generated by laser source 1010b travel along optical pathway 1030b (thereby producing laser beam(s) having certain energy beam characteristics) and are delivered to the "thick" region 1020b of the thin film. In certain embodiments, the energy beam characteristics of the laser beam(s) that is delivered to the "thin" region 1020a differs from the energy beam characteristics of the laser beam(s) that is delivered to the "thick" region 1020b. In certain embodiments of the system depicted in FIG. 10, the processing of the "thin" region 1020a of the thin film is processed either before or after the processing of the "thick" region 1020b of the thin film. In certain other embodiments of the system depicted in FIG. 10, however, the processing of the "thin" region 1020a of the thin film is performed concurrently with the processing of the "thick" region 1020b of the thin film.

Figure 11:
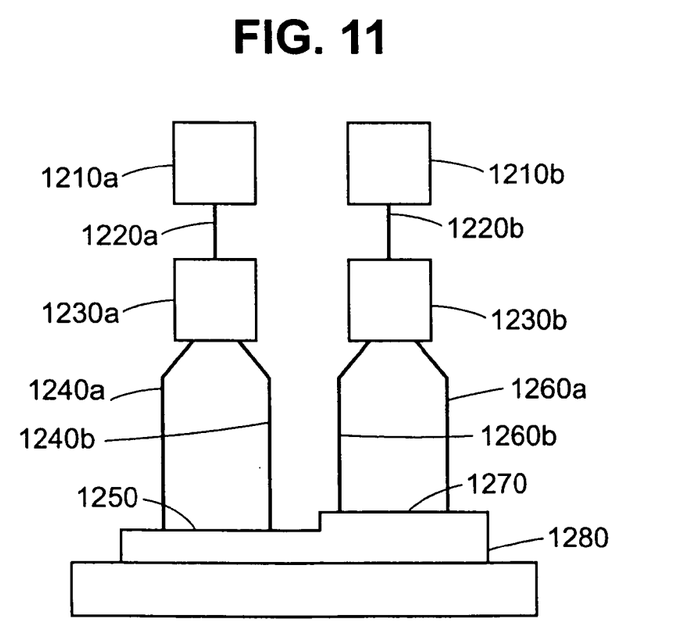
FIG. 11 is an illustration of an apparatus having two laser systems, each having two optical pathways, for use in one or more embodiments of the present invention.

In some embodiments, a plurality of laser systems, which each use a plurality of optical pathways, can be employed. In such embodiments, each laser system can be made up of one or more laser sources. In such embodiments, different laser systems can be used to process different regions of the thin film. For example, laser beams generated by the laser source(s) of a first laser system and by the laser source(s) of a second laser system can be directed along two other different optical paths so as to process a "thick" region of the thin film. The laser beam(s) generated by the laser source(s) of the first laser system can be directed to the corresponding optical paths via a beam steerer or a beam splitter depending upon whether the generated laser beam(s) are to be split or not. The laser beams(s) of the second laser system can be processed and handled similarly. The laser beams that are directed to the "thin" region may have similar or different energy beam characteristics. Similarly, the laser beams that are directed to the "thick" region may have similar or different energy beam characteristics. An exemplary embodiment having two independent laser systems 1210a and 1210b with corresponding beam splitters 1230a and 1230b is depicted in FIG. 11. The laser beams 1220a and 1220b generated by laser systems 1210a and 1210b pass through beam splitters 1230a and 1230b, respectively. Beam splitter 1230*a* directs a portion of laser beam 1220*a* onto optical path 1240*a* and directs the remaining portion of laser beam 1220*a* onto optical path 1240*b* so that both energy beams (which may have similar or different energy beam characteristics) can simultaneously irradiate different portions of the "thin" region 1250 of the thin film. Similarly, beam splitter 1230*b* directs a portion of laser beam 1220*b* onto optical path 1260*a* and directs the remaining portion of laser beam 1220*b* onto optical path 1260*b* so that both energy beams (which may have similar or different energy beam characteristics) can simultaneously irradiate different portions of the "thick" region 1280 of the thin film.

In still other embodiments as described above, beam splitters can operate as a beam steering elements that can operate in a transmissive or pass-through mode and a reflective or redirect mode. While operating in a pass-through mode, the laser beams entering the beam steering element essentially pass completely through the beam steering element onto a first optical path. While operating in a redirect mode, the laser beams entering the beam steering element are essentially completely redirected by a reflective surface(s) onto a second optical path.

Further detail is provided in co-pending patent application entitled "Systems And Methods For Inducing Crystallization of Thin Films Using Multiple Optical Paths" filed on even date herewith, and in co-pending patent application entitled "Systems And Methods For Processing Thin Films" filed on even date, the contents of which are incorporated by reference.

The devices fabricated by the present invention include not only an element such as a TFT or a MOS transistor, but also a liquid crystal display device (TFT-LCDs), an EL (Electro Luminescence) display device, an EC (Electro Chromic) display device, active-matrix organic light emitting diodes (OLEDs), static random access memory (SRAM), three-dimensional integrated circuits (3-D ICs), sensors, printers, and light valves, or the like, each including a semiconductor circuit (microprocessor, signal processing circuit, high frequency circuit, etc.) constituted by insulated gate transistors.

Although various embodiments that incorporate the teachings of the present invention have been shown and described in detail herein, those skilled in the art can readily devise many other varied embodiments that incorporate these teachings.

The invention claimed is:

1. A film on a substrate, comprising:
a first crystalline region having a first film thickness and a crystalline grain structure having highly elongated crystal grains that are defined by a first set of grain boundaries that are substantially parallel to long axes of the grains; and
a second crystalline region having a second film thickness and one of a homogeneous small grained polycrystalline grain structure and a crystalline grain structure having elongated crystal grains that are defined by a first set of grain boundaries that are substantially parallel to long axes of the grain, wherein the first film thickness is greater than the second film thickness, wherein the first and second crystalline regions have a size sufficient to accommodate an active channel of an electronic device, and wherein the first region possesses fewer grain boundaries or other defects per unit area than the second region.

2. The film of claim 1, wherein the first and/or second crystalline region comprises a component of an electronic device.

3. The film of claim 2, wherein said component is an active channel for a diode or thin film transistor.

4. The film of claim 1, wherein the mobility of the first crystalline region of the film is greater than the mobility of the second crystalline region of the film.

5. The film of claim 1, wherein the first crystalline region of the film comprises an active channel for a high mobility thin film transistor.

6. The film of claim 5, wherein the second crystalline region of the film comprises an active channel for a low mobility thin film transistor.

7. The film of claim 1, wherein the film comprises a semiconductor material.

8. The film of claim 1, wherein the film comprises a metal.

9. The film of claim 1, wherein the first film thickness is in the range of about 50 nm to about 500 nm.

10. The crystalline film of claim 1, wherein the second film thickness is in the range of about 20 nm to about 200 nm.

11. The film of claim 1, wherein the first and/or second crystalline regions comprise a single crystal subregion having a dimension large enough to accommodate an active channel of a thin film transistor.

12. The film of claim 1, wherein the second crystalline region comprises elongated crystal grains that are defined by a first set of grain boundaries that are substantially parallel to long axes of the grains.

13. The film of claim 1, wherein the second crystalline region comprises elongated crystal grains that are defined by a first set of grain boundaries that are substantially parallel to long axes of the grains and a second set of grain boundaries that are substantially perpendicular to the long axes of the grains to define columns of elongated crystals.

14. The film of claim 1, wherein the second crystalline region comprises a homogeneous small grained polycrystalline grain structure.

15. The film of claim 1, wherein the elongated grains of the first crystalline region further comprise a second set of grain boundaries that are substantially perpendicular to the long axes of the grains to define columns of elongated crystals.

16. The film of claim 15, wherein the second crystalline region comprises elongated crystal grains that are defined by a first set of grain boundaries that are substantially parallel to long axes of the grains.

17. The film of claim 15, wherein the second crystalline region comprises a homogeneous small grained polycrystalline grain structure.

18. The film of claim 15, wherein the second crystalline region comprises elongated crystal grains that are defined by a first set of grain boundaries that are substantially parallel to long axes of the grains and a second set of grain boundaries that are substantially perpendicular to the long axes of the grains to define columns of elongated crystals.

* * * * *